United States Patent
Hammi et al.

(10) Patent No.: US 9,484,861 B1
(45) Date of Patent: Nov. 1, 2016

(54) METHOD FOR SYSTEM LEVEL ORIENTED LOAD-PULL-BASED ENVELOPE TRACKING POWER AMPLIFIERS

(71) Applicant: KING FAHD UNIVERSITY OF PETROLEUM AND MINERALS, Dhahran (SA)

(72) Inventors: Oualid Hammi, Sharjah (AE);
Mohamed Osman Hussein Khalifa, Khartoum (SD)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 14/951,470

(22) Filed: Nov. 24, 2015

(51) Int. Cl.
H03G 3/20 (2006.01)
H03F 1/02 (2006.01)
H03F 3/19 (2006.01)
H03F 3/21 (2006.01)

(52) U.S. Cl.
CPC ............ *H03F 1/0211* (2013.01); *H03F 3/19* (2013.01); *H03F 3/21* (2013.01); *H03F 2200/102* (2013.01); *H03F 2200/451* (2013.01)

(58) Field of Classification Search
None
See application file for complete search history.

(56) References Cited

U.S. PATENT DOCUMENTS

| 7,138,861 | B2 | 11/2006 | Sundström et al. | |
| 8,456,175 | B2 | 6/2013 | Marchetti et al. | |
| 8,824,978 | B2 * | 9/2014 | Briffa | H03F 1/32 330/124 R |
| 8,829,993 | B2 | 9/2014 | Briffa et al. | |
| 2011/0241775 | A1 * | 10/2011 | Kunihiro | H03F 1/0222 330/127 |
| 2011/0273187 | A1 | 11/2011 | Ghannouchi et al. | |
| 2011/0285460 | A1 * | 11/2011 | Murao | H04B 1/0483 330/124 R |
| 2012/0161784 | A1 | 6/2012 | Benedikt | |
| 2013/0187711 | A1 * | 7/2013 | Goedken | H03F 1/0227 330/149 |
| 2013/0285743 | A1 * | 10/2013 | Onishi | H03F 1/0222 330/149 |
| 2014/0213196 | A1 * | 7/2014 | Langer | H03F 3/189 455/73 |
| 2014/0306763 | A1 * | 10/2014 | Hong | H03F 3/195 330/291 |
| 2015/0236877 | A1 * | 8/2015 | Peng | H04L 25/08 375/297 |

FOREIGN PATENT DOCUMENTS

WO WO 2014/007703 A1 1/2014

OTHER PUBLICATIONS

Hu, "Design of a Power Amplifier and Envelope Amplifier for a Multi-band Multi-standard Envelope Tracking System," Dissertation at the University of Waterloo, 2012.

* cited by examiner

*Primary Examiner* — Patricia T Nguyen
(74) *Attorney, Agent, or Firm* — Richard C. Litman

(57) ABSTRACT

The method for system level oriented load-pull-based envelope tracking power amplifiers includes steps of performing a multi-dimensional load-pull and selecting the reflection coefficients to be presented to the transistor while taking into account the system level architecture of the power amplifier. It is shown that adopting the proposed load reflection coefficient selection algorithm leads to an additional efficiency enhancement. This extra performance is achieved without additional circuitry or cost.

6 Claims, 6 Drawing Sheets

METHOD FOR SYSTEM LEVEL ORIENTED LOAD-PULL-BASED ENVELOPE TRACKING POWER AMPLIFIERS

BACKGROUND OF THE INVENTION

1. Field of the Invention

The present invention relates to power amplifier circuits and radio frequency transmitter systems, and particularly to a method for system level oriented load-pull-based envelope tracking power amplifiers.

2. Description of the Related Art

The evolution of wireless communication systems has always been driven by the need to enhance the users' connectivity by accommodating, within the limited radio frequency (RF) spectrum, the largest number of users with increasingly high data throughputs. This was accomplished by combining compact modulation schemes with advanced access technologies, such as orthogonal frequency division and code division-based multiplexing techniques (OFDM and CDMA, respectively). The resulting spectral efficient techniques translate into time domain signals that have strong amplitude fluctuations and high peak-to-average power ratio (PAPR).

The amplitude modulation of these signals makes them highly sensitive to analog RF front-end nonlinear distortions, whereas their high PAPR makes efficient amplification challenging. Thus, the design of modern base station power amplifiers calls for a trade-off between efficiency and linearity. Since linearity is a must in order to meet the spectral emission regulations, the linearity-efficiency trade-off is often biased toward linearity, and the design constraint is formulated as meeting the linearity requirements with the highest possible efficiency.

Several approaches have been considered for power efficient linear amplification in base station radio systems. The trend is to use power-efficient but mildly nonlinear power amplifiers in conjunction with system level linearization techniques (namely, digital predistortion). The main objective is to increase the efficiency of the power amplifier in the back-off region where the signal probability is high in order to enhance the overall average power efficiency when high PAPR signals are transmitted. The most popular solutions are based on dynamic modulation concepts or switching mode amplifiers. These can be categorized in two classes: dynamic load modulation and dynamic bias modulation. Doherty power amplifiers represent the dynamic load modulation approach, where a carrier and a peaking amplifier modulate their mutual load impedances to achieve high efficiency in the back-off region. Doherty power amplifiers are widely used in base station radio systems. However, their adoption for future systems presents several challenges, mainly related to maintaining the load modulation mechanism for broadband and multi-band applications. Envelope tracking (ET) power amplifiers represent the most promising alternative for dynamic bias modulation power amplifiers, which also includes envelope elimination and restoration technique. In ET power amplifiers, the drain supply voltage of the power amplifier is varied as a function of the input signal's envelope in order to reduce the DC power consumption of the amplifier and consequently improve its power efficiency. The advantage of such polar structure is its suitability for broadband and multi-band applications when compared to the Doherty architecture.

Traditionally, the design of any RF power amplifier starts with the load-pull characterization. The results of this step are used to select the appropriate load and source reflection coefficients to be presented at output and input of the transistor, respectively. What is needed is a design approach customized to envelope tracking power amplifiers.

Thus, a method for system level oriented load-pull-based envelope tracking power amplifiers solving the aforementioned problems is desired.

SUMMARY OF THE INVENTION

The method for system level oriented load-pull-based envelope tracking power amplifiers includes steps of performing a multi-dimensional load-pull and selecting the reflection coefficients to be presented to the transistor while taking into account the system level architecture of the power amplifier. It is shown that adopting the proposed load reflection coefficient selection algorithm leads to an additional efficiency enhancement. In the considered design example, the efficiency improvement is of approximately 3%, from 44.2% to 47.3%. This extra performance is achieved without additional circuitry or cost.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The method for system level oriented load-pull-based envelope tracking power amplifiers includes steps of performing a multi-dimensional load-pull and selecting the reflection coefficients to be presented to the transistor while taking into account the system level architecture of the power amplifier. It is shown that adopting the proposed load reflection coefficient selection algorithm leads to an additional efficiency enhancement. In the exemplary design reported here, the efficiency enhancement is of approximately 3%, from 44.2% to 47.3%. This extra performance is achieved without additional circuitry or cost.

Several shaping functions have been reported in the literature in order to efficiently map the instantaneous envelope signal into a variable drain supply. Among these, two analytically defined shaping functions were demonstrated to achieve satisfactory performance with high PAPR modulated communication signals. These are, namely, the Wilson and the Nujira N6 shaping functions. In the Nujira N6 shaping function, the instantaneous drain voltage ($v_{D\_N6}(n)$) is related to the instantaneous baseband input envelope signal ($v_e(n)$) according to:

$$V_{D\_N6}(n) = \sqrt[6]{V_{min}^6 + V_e^6(n)} \quad (1)$$

where $v_{min}$ is the minimum drain voltage that can be supplied by the envelope tracking path. For the Wilson shaping function, the variable drain bias ($v_{D\_W}(n)$) is given by:

$$V_{D\_W}(n) = \frac{\pi}{\pi-2} V_{min} \left[1 - \left(\frac{2}{\pi}\right) \cos\left[V_e(n)\frac{\pi-2}{2V_{min}}\right]\right] \quad (2)$$

where $v_{min}$ and $v_e(n)$ are the same as in Equation (1).

This brief overview clearly demonstrates that for a given drive signal, the operating conditions of a constant supply voltage amplifier are different from that of an envelope tracking amplifier. Accordingly, for optimal performance of envelope tracking power amplifiers, a design approach tailored for the specificities of the envelope tracking configuration is needed.

In constant supply voltage power amplifiers, the load-pull carried out to determine the optimal input and output reflection coefficients to be presented to the transistor is performed at the operating voltage supply of the power amplifier. By acquiring the load-pull data at the constant supply voltage, it is possible to determine the optimal load reflection coefficient that would maximize the efficiency, the linearity, or the tradeoff between these two desired PA features.

Figure 3:
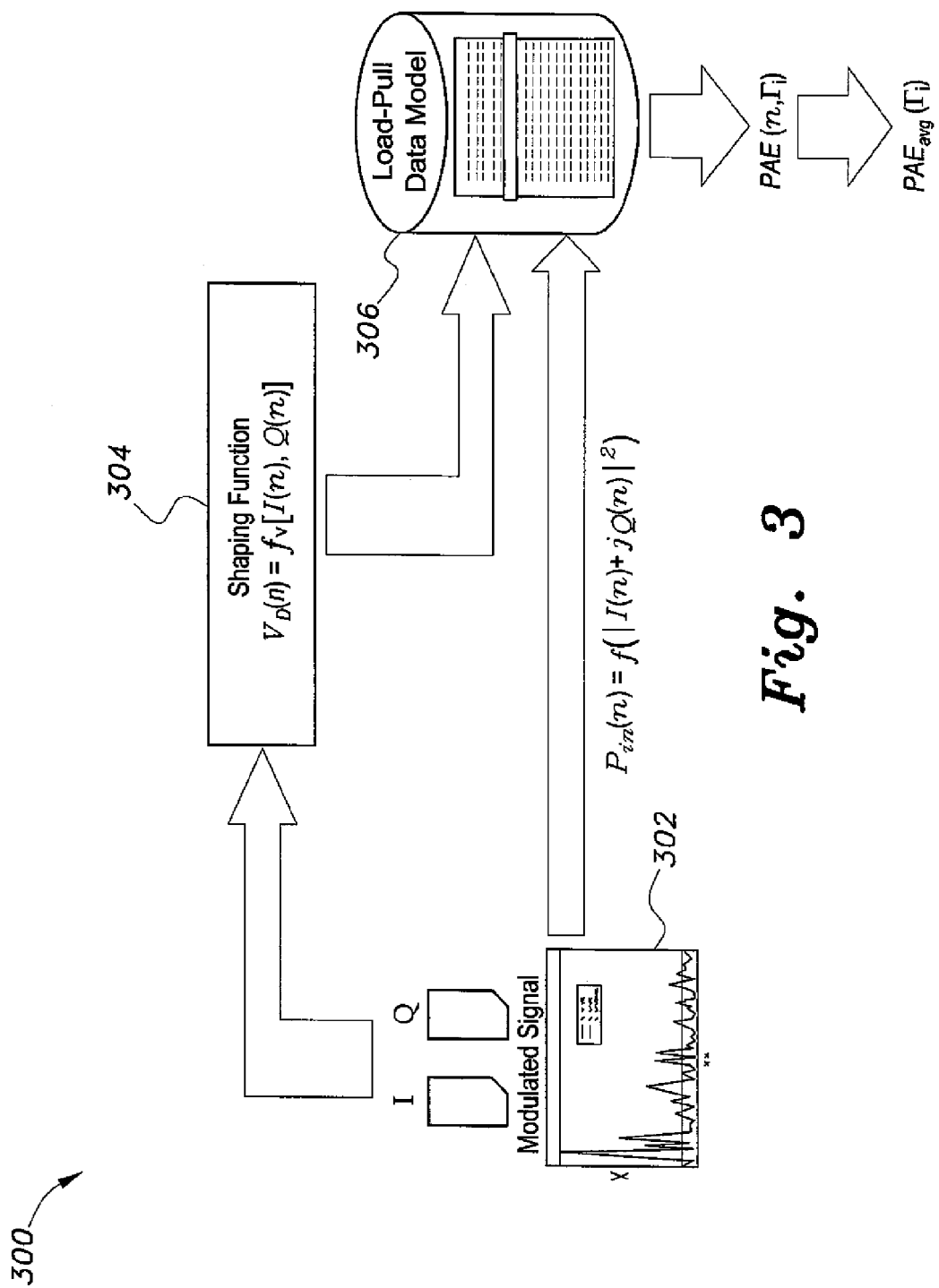
FIG. 3 is a schematic diagram of a load-pull data processing technique adapted for use with a modulated power supply according to the present invention.

In order to take into consideration the high PAPR of the signals to be transmitted by the amplifier, a co-simulation is developed in Keysight's Advanced Design System (ADS) software using a large signal model of a Gallium Nitride (GaN)-based transistor. The principal of this simulation, as depicted in FIG. 3, is based on calculating the average efficiency under a modulated test signal as a function of the load reflection coefficient. For this purpose, a table-based model including the load-pull data of the transistor was built. This model, which includes input and output powers, gain, and efficiency of the transistor as a function of the load reflection coefficient, is used to estimate the instantaneous performance of the power amplifier as a function of the load reflection coefficient. The load-pull data model is a table-based model that can be described by:

$$[P_{out}(n)\eta(n)] = F_{Const.\ Supply}(P_{in}(n)_s\Gamma_L) \quad (3)$$

where $P_{in}$ and $P_{out}$ are the input and output powers of the device under test, respectively, $\eta$ represents the drain efficiency of the amplifier, and $\Gamma_L$ is the load reflection coefficient presented to the transistor.

Figure 1:
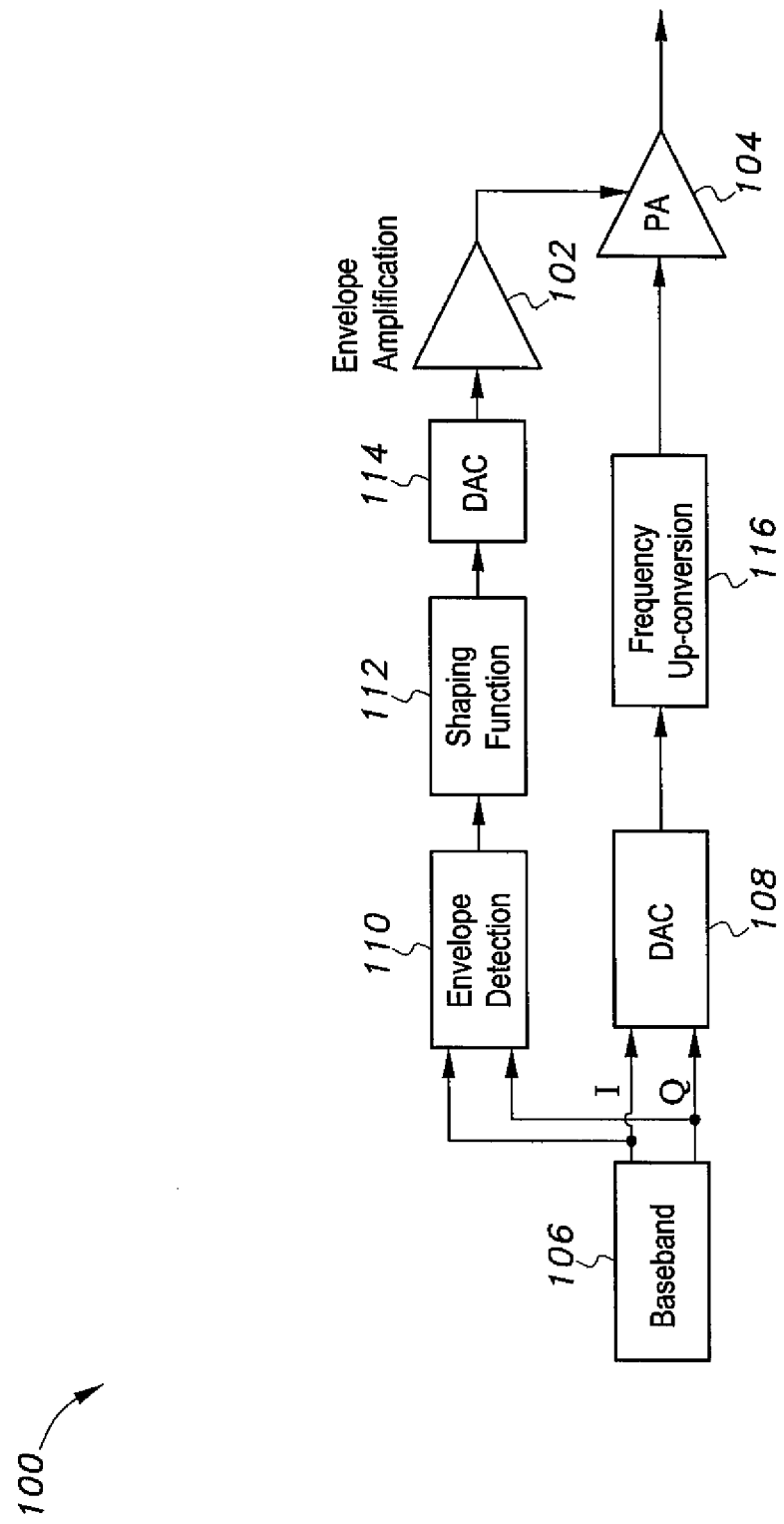
FIG. 1 is a block diagram of a conventional envelope tracking power amplifier (PA).

In the block diagram of FIG. 1, the envelope tracking power amplifier (PA) system 100 includes a baseband circuit 106 connected to an envelope detector 110 and to a digital-to-analog converter (DAC) 108. The envelope detector 110 has an output that feeds input to a shaping function generator 112. The output of the shaping function generator 112 feeds another digital-to-analog converter (DAC) 114, which, in turn, feeds an envelope amplifier 102. The output of the envelope amplifier 102 is fed to and biases a power amplifier (PA) 104. The baseband fed DAC 108 feeds a frequency up-converter 116, which serves as an input to the PA 104.

Figure 2:
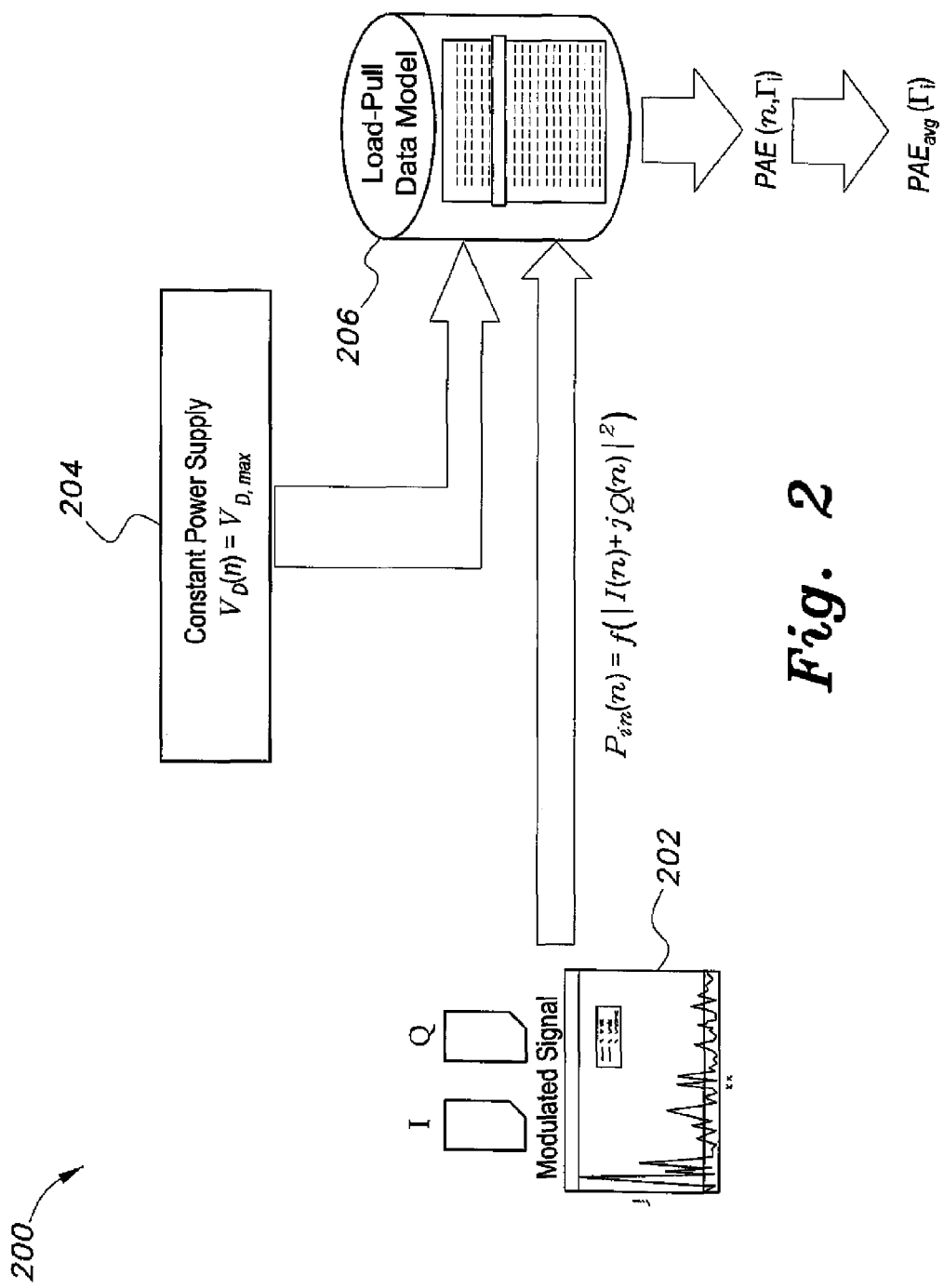
FIG. 2 is a schematic diagram of a conventional load-pull data processing technique used to evaluate a power amplifier.

FIG. 2 is a schematic diagram that shows conventional load-pull data processing 200 where the performance of the amplifier is evaluated in terms of instantaneous power efficiency, and consequently, the average efficiency is derived. However, the load-pull based model can be used to evaluate the linearity of the amplifier as a function of the load reflection coefficient, and/or both the efficiency and linearity performance of the amplifier as a function of the load reflection coefficient. In the present method, the design objective is to maximize the power-added efficiency, since linearity is typically recovered by using, at the system level, linearization techniques, such as digital predistortion.

Traditionally, the load-pull data processing 200 is extended to the case of envelope tracking power amplifiers by performing the load-pull at the peak value of the drain supply voltage. As shown in FIG. 2, a constant power supply 204 feeds a load-pull data model 206. The modulated signal 202 also feeds the load-pull data model 206. However, since the envelope tracking amplifier will be operating at various drain voltages and most of the time far below the peak value of the drain voltage, it is expected that the conventional load-pull approach will lead to sub-optimal performances when used for the design of envelope tracking power amplifiers. For this purpose, a novel multi-dimensional load-pull approach was developed. In the present method, a plurality of load-pull based models is generated. These models correspond to various drain supply voltages that cover the range of variations of the envelope tracking amplifier's drain voltage. The principle of the present load-pull data processing 300 for optimal reflection coefficients selection is illustrated in FIG. 3. As shown in FIG. 3, the modulated signal 302 feeds a shaping function generator 304. Both the modulated signal 302 and a shaping function generator 304 feed the load-pull data model 306. It should be understood that the modulated signal 302 and the shaping function generator 304 build the load-pull data model 306. Similar to the constant supply voltage case, the proposed multi-dimensional model can be used to optimize the load reflection coefficient for efficiency, linearity, or a combination of both.

The present approach differs in two major ways when compared to the load-pull processing 200 of FIG. 2. First, output variables of the model are not only a function of the input power and the load reflection coefficient ($P_{in}$ and $\Gamma_L$), but also depend on the instantaneous supply voltage ($V_D(n)$), as depicted through Equation (4).

$$[P_{out}(n)\eta(n)] = f_{Modul.\ Supply}(P_{in}(n)\Gamma_L,V_D)(n)). \quad (4)$$

Second, the present load-pull data processing 300 provides flexibility in the voltage shaping function, since the instantaneous drain voltage is calculated as a function of the instantaneous complex input sample according to:

$$V_D(n) = f_V(I(n),Q(n)). \quad (5)$$

Figure 4:
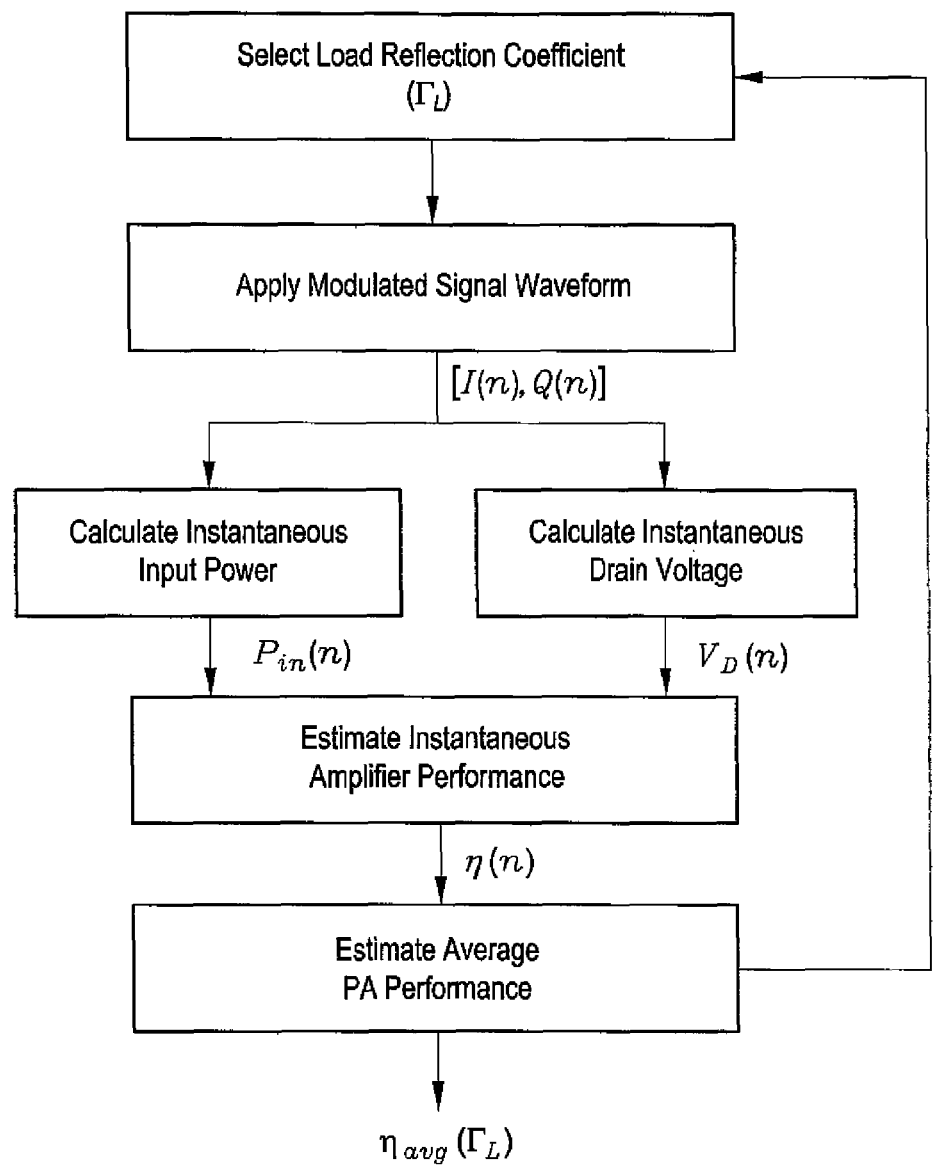
FIG. 4 is a flowchart of load coefficients selection process in a method for system level oriented load-pull-based envelope tracking power amplifiers according to the present invention.

The voltage shaping function is implemented in a symbolically defined device (SDD) component in Advanced Design System Software. The load reflection coefficient selection method 400 using the proposed multi-dimensional load-pull model 300 is shown in the flowchart of FIG. 4 and described in Table 1 below.

TABLE 1

Load Reflection Coefficient Selection Algorithm

| Step | Function | Symbol |
|---|---|---|
| 1 | Select Load Reflection Coefficient | ($\Gamma_L$) |
| 2 | Apply Modulated Signal Waveform | [I(n), Q(n)] |

TABLE 1-continued

Load Reflection Coefficient Selection Algorithm

| Step | Function | Symbol |
|---|---|---|
| 3 | Calculate Instantaneous Input Power | $P_{in}$ (n) |
| 4 | Calculate Instantaneous Drain Voltage | $V_D$ (n) |
| 5 | Estimate Instantaneous Amplifier Performance | $\eta$ (n) |
| 6 | Estimate Average Amplifier Performance | $\eta_{avg}$ ($\Gamma_L$) |

Figure 5:
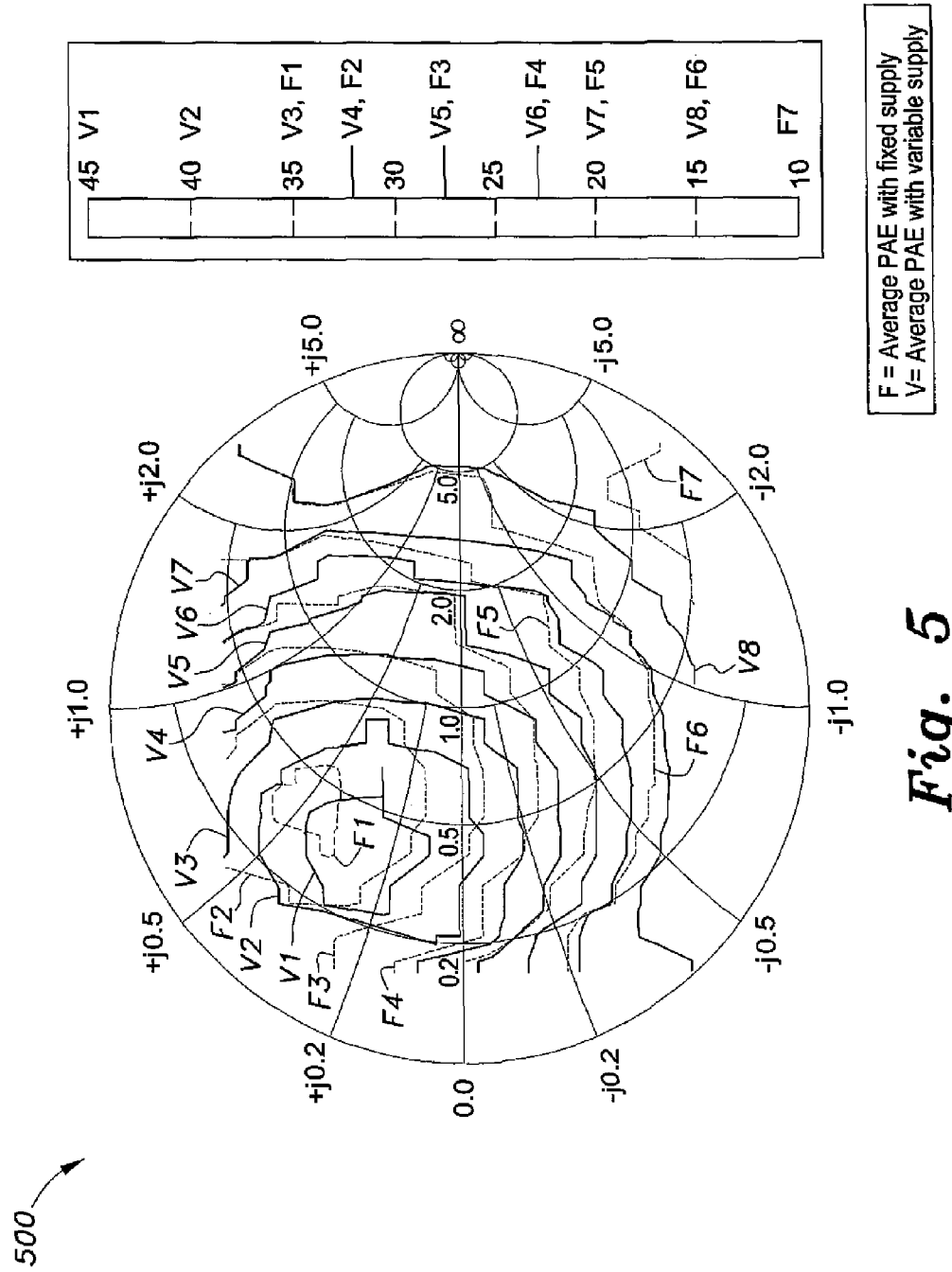
FIG. 5 is a plot showing PAE contours for fixed and modulated drain supply voltages using a Nujira N6 shaping function.
Figure 6:
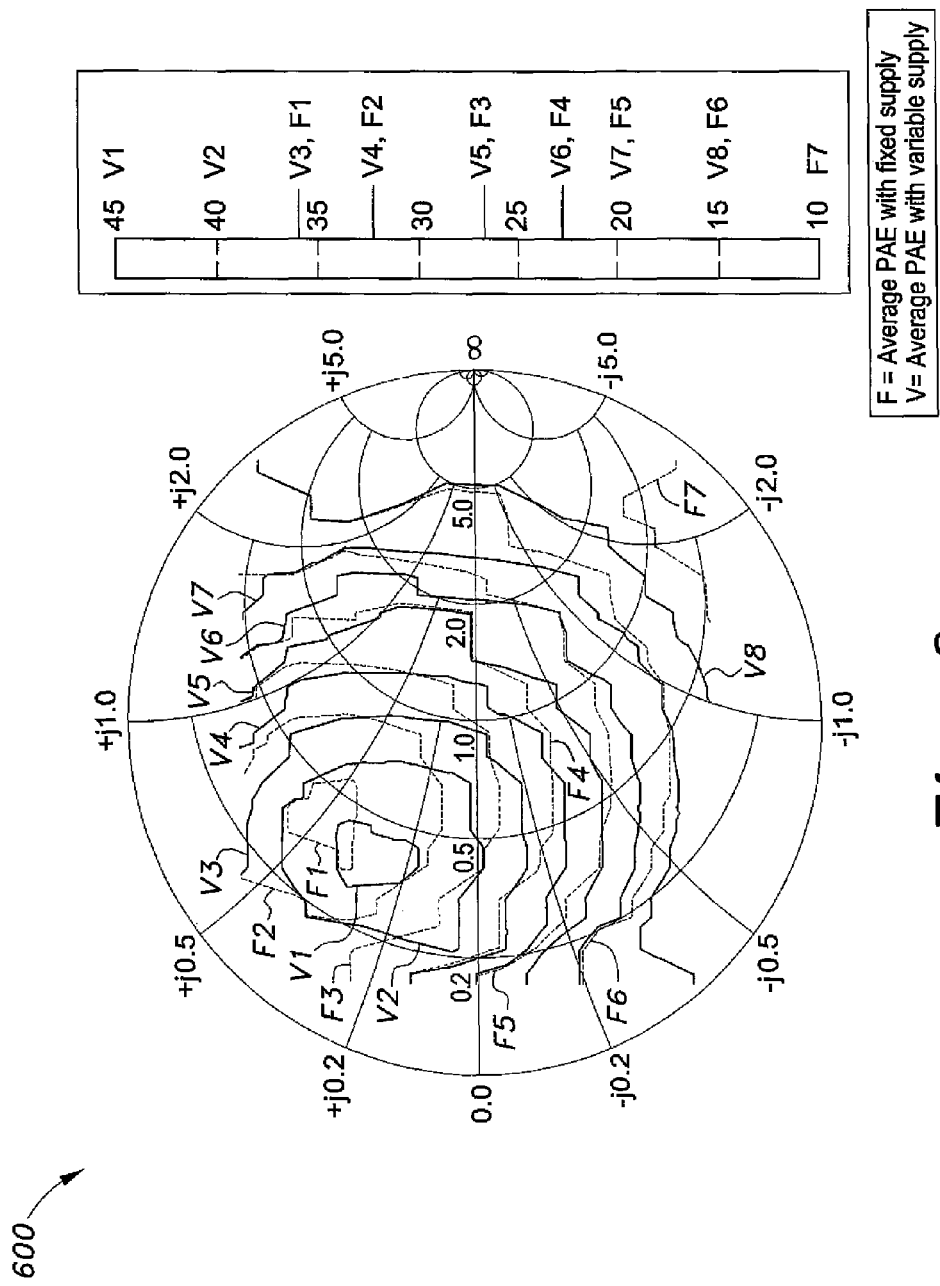
FIG. 6 is a plot showing PAE contours for fixed and modulated drain supply voltages using a Wilson shaping function.

Steps one through six are repeated until the average PA performance estimation falls within predetermined parameters. The present method was used to find the optimum load reflection coefficient when two different shaping functions were used in the envelope tracking path, namely; the Nujira N6 shaping function and the Wilson shaping function, respectively. A 10 W GaN transistor (model CGH40010 from Cree) was used for the design of an envelope tracking power amplifier operating around 2.14 GHz. An LTE signal having a peak-to-average power ratio (PAPR) of 10.04 dB and a 20 MHz bandwidth was used as an input signal to the system. The algorithm was implemented using co-simulation between Advanced Design System software and MATLAB2010a software on an Intel 1.73 GHz Core i5 computer with 4 GB of RAM. The PAE contours for fixed and variable drain bias are shown as plot 500 and plot 600 of FIGS. 5 and 6 for Nujira N6 and Wilson shaping functions, respectively. As shown in plots 500 and 600, the PAE levels achieved using variable drain supply voltage are higher than those of constant supply voltage, as expected. Most importantly, in both plots 500 and 600, there is a shift in the load-pull contours between the cases of the constant and variable supply voltages. This clearly demonstrates the suitability of the present method. Indeed, the displacement of the load-pull contours indicates that the maximum average power-added efficiencies are obtained for different load reflection coefficient values, depending on whether the PA is operated with a constant or a variable drain supply voltage.

For the fixed supply PA, the optimum load reflection coefficient for which the average power-added efficiency of the amplifier is maximized was found to be $\Gamma_{L\_Const.\ Supply}$=0.436|119.68, and it results in a maximum average power-added efficiency of 35.4%. However, if this same load reflection coefficient is adopted for the envelope tracking power amplifier, it will result in power-added efficiencies of 44.2% and 43.5% when the Nujira N6 and the Wilson shaping functions are used, respectively. Conversely, if the present method is adopted for the selection of the load reflection coefficient by considering the solid line contours of plot 500 and plot 600, $\Gamma_{L\_Modul.\ Supply}$=0.457|150.24 is found to be the optimum load reflection coefficient that will maximize the average power-added efficiency of the envelope tracking power amplifier. For this load reflection coefficient, the average power-added efficiency of the envelope tracking power amplifier employing the Nujira N6 shaping function rises from 44.2% to 47.3%. A similar enhancement in the average power-added efficiency is observed for the case of the envelope tracking PA employing the Wilson shaping function. Indeed, the use of the proposed load reflection coefficient selection technique leads to an average power-added efficiency of 46.0%, in contrast with the 43.5% obtained using the conventional technique for load reflection coefficient selection. These results show that 2.5% to 3% improvement in the power-added efficiency can be obtained by adopting the proposed technique.

It is to be understood that the present invention is not limited to the embodiments described above, but encompasses any and all embodiments within the scope of the following claims.

We claim:

1. A method for system level oriented load-pull-based envelope tracking power amplifiers (PAs), comprising the steps of:
    (a) selecting a load reflection coefficient, ($\Gamma_L$);
    (b) applying direct and quadrature components, [I(n), Q(n)], of a modulated signal waveform;
    (c) calculating instantaneous input power $P_{in}$ (n);
    (d) calculating instantaneous drain voltage of the PA;
    (e) estimating instantaneous amplifier performance $\eta$(n);
    (f) estimating average amplifier performance $\eta_{avg}$($\Gamma_L$); and
    (g) repeating steps (a) through (f) until a desired average amplifier performance is achieved.

2. The method for system level oriented load-pull-based envelope tracking power amplifiers according to claim 1, further comprising the step of applying the direct and quadrature components, [I(n), Q (n)] to a shaping function characterized by:

$$V_D(n)=f_v(I(n),Q(n)),$$

where $V_D$(n) is the instantaneous supply voltage.

3. The method for system level oriented load-pull-based envelope tracking power amplifiers according to claim 2, wherein the instantaneous input power calculation step further comprises the step of calculating the instantaneous input power according to a formula characterized by:

$$P_{in}(n)=f(|I(n)+jQ(n)|^2).$$

4. The method for system level oriented load-pull-based envelope tracking power amplifiers according to claim 3, wherein output variables of the model are not only a function of the input power and the load reflection coefficient ($P_{in}$ and $\Gamma_L$), but also depend on the instantaneous supply voltage ($V_D$(n)), as characterized by:

$$[P_{out}(n)\eta(n)]=f_{Modul.Supply}(P_{in}(n),\Gamma_L,V_D(n)).$$

5. The method for system level oriented load-pull-based envelope tracking power amplifiers according to claim 4, wherein the shaping function is a Nujira N6 shaping function characterized by:

$$V_{D\_N6}(n) = \sqrt[6]{V_{min}^6 + V_e^6(n)},$$

where $v_{min}$ the minimum drain voltage that can be supplied by the envelope tracking path.

6. The method for system level oriented load-pull-based envelope tracking power amplifiers according to claim 4, wherein the shaping function is a Wilson shaping function characterized by:

$$V_{D\_W}(n) = \frac{\pi}{\pi-2}V_{min}\left[1-\left(\frac{2}{\pi}\right)\cos\left[V_e(n)\frac{\pi-2}{2V_{min}}\right]\right],$$

where ($v_{D\_W}$(n)) is a variable drain bias, and $v_{min}$ is the minimum drain voltage that can be supplied by the envelope tracking path.

* * * * *